US008466071B2

(12) United States Patent
Koyata et al.

(10) Patent No.: US 8,466,071 B2
(45) Date of Patent: Jun. 18, 2013

(54) METHOD FOR ETCHING SINGLE WAFER

(75) Inventors: Sakae Koyata, Tokyo (JP); Tomohiro Hashii, Tokyo (JP); Katsuhiko Murayama, Tokyo (JP); Kazushige Takaishi, Tokyo (JP); Takeo Katoh, Tokyo (JP)

(73) Assignee: Sumco Corporation, Tokyo (JP)

( * ) Notice: Subject to any disclaimer, the term of this patent is extended or adjusted under 35 U.S.C. 154(b) by 804 days.

(21) Appl. No.: 12/162,829

(22) PCT Filed: Jan. 24, 2007

(86) PCT No.: PCT/JP2007/051034
§ 371 (c)(1), (2), (4) Date: Jul. 31, 2008

(87) PCT Pub. No.: WO2007/088755
PCT Pub. Date: Aug. 9, 2007

(65) Prior Publication Data
US 2009/0004876 A1 Jan. 1, 2009

(30) Foreign Application Priority Data

Jan. 31, 2006 (JP) .................................. 2006-021900

(51) Int. Cl.
*H01L 21/302* (2006.01)
(52) U.S. Cl.
USPC ........... 438/748; 438/745; 438/747; 438/753; 438/906; 216/83; 216/84; 216/90; 216/91; 216/92
(58) Field of Classification Search
USPC ................... 216/84, 90, 91, 92, 83; 438/753, 438/906, 745, 747, 748
See application file for complete search history.

(56) References Cited

U.S. PATENT DOCUMENTS 6,096,233 A * 8/2000 Taniyama et al. ............... 216/92
6,232,228 B1 5/2001 Kwag et al.
(Continued)

FOREIGN PATENT DOCUMENTS

DE 199 28 570 12/1999
JP 58-046643 3/1983
(Continued)

OTHER PUBLICATIONS

Korean Office Action dated Jan. 14, 2011 that issued with respect to patent family member Korean Patent Application No. 10-2008-7019037, along with an English language translation thereof.

(Continued)

*Primary Examiner* — Nadine G Norton
*Assistant Examiner* — Christopher Remavege
(74) *Attorney, Agent, or Firm* — Greenblum & Bernstein, P.L.C.

(57) ABSTRACT

An object of the present invention is to provide a method for etching a single wafer, which effectively realizes a high flatness of wafer and an increase in productivity thereof. In a method for etching a single wafer, a single thin disk-like wafer sliced from a silicon single crystal ingot is spun, and a front surface of the wafer is etched with an etching solution supplied thereto. In the method, a plurality of supply nozzles are disposed above and opposite to the front surface of the wafer at different portions in the radial direction of the wafer, respectively; and then one or more conditions selected from the group consisting of temperatures, kinds, and supply flow rates of etching solutions from the plurality of supply nozzles are changed.

2 Claims, 6 Drawing Sheets

U.S. PATENT DOCUMENTS

| | | | |
|---|---|---|---|
| 7,182,821 B2 * | 2/2007 | Izumi et al. | 134/36 |
| 7,252,778 B2 * | 8/2007 | Iwamoto et al. | 216/84 |
| 7,396,483 B2 * | 7/2008 | Delattre | 216/92 |
| 7,439,190 B2 * | 10/2008 | Tanaka | 438/756 |
| 2002/0026985 A1 | 3/2002 | Kai | |
| 2002/0034881 A1 * | 3/2002 | Kulkarni et al. | 438/753 |
| 2003/0171075 A1 * | 9/2003 | Nihonmatsu et al. | 451/41 |
| 2005/0000940 A1 * | 1/2005 | Iwamoto et al. | 216/83 |
| 2007/0231483 A1 * | 10/2007 | Nanba et al. | 427/240 |

FOREIGN PATENT DOCUMENTS

| | | |
|---|---|---|
| JP | 11-135464 | 5/1999 |
| JP | 2000-031114 | 1/2000 |
| JP | 2002-064079 | 2/2002 |
| JP | 2004-111668 | 4/2004 |
| JP | 2004-111668 A | 4/2004 |
| WO | 2007/031920 | 3/2007 |

OTHER PUBLICATIONS

Taiwanese Office Action dated Oct. 25, 2010 that issued with respect to patent family member Taiwanese Patent Application No. 096103355, along with an English language translation thereof.

E.P.O. Office action that issued with respect to patent family member European Patent Application No. 07707285.8, mail date is Apr. 4, 2011.

English language translation of patent abstract 11-135464.

English language translation of patent abstract 199 28 570.

Korean Office Action dated Jul. 14, 2010 that issued with respect to patent family member Korean Patent Application No. 10-2008-7019037, along with an English language translation thereof.

Taiwanese Office Action dated Apr. 13, 2010 that issued with respect to patent family member Taiwanese Patent Application No. 096103355, along with an English language translation thereof.

Australian Written Opinion dated Nov. 25, 2009 that issued with respect to patent family member Singapore Patent Application No. 200805189-8.

Japan Office action that issued with respect to patent family member Japanese Patent Application No. 2007-556821, dated Apr. 19, 2011 along with an english translation thereof.

Japan Office action that issued with respect to patent family member Japanese Patent Application No. 2007-556821, dated Jun. 28, 2011 along with an english translation thereof.

Korean Office Action (Trial Decision) that issued with respect to counterpart Korean Patent Application No. 2008-7019037, dated Nov. 8, 2011, along with an english translation thereof.

* cited by examiner

METHOD FOR ETCHING SINGLE WAFER

TECHNICAL FIELD

The present invention relates to a method for etching the front surface of a wafer one by one, where the wafer is rotated while an etching solution is supplied onto the front surface of the wafer.

BACKGROUND ART

In general, the process for manufacturing a semiconductor wafer comprises the steps of obtaining wafers by cutting and slicing out of a single crystal ingot, and chamfering the respective wafers, mechanical grinding (lapping), etching, mirror-polishing, and cleaning, thereby producing a wafer with highly precise flatness. The wafer, which has been subjected to the steps for mechanical processing, such as block-cutting, rounding, slicing, and lapping, has a damaged layer (i.e., a processing-strained layer) on the surface thereof. In the process for device production, such a processing-strained layer causes crystal defects, such as slip dislocation, and the mechanical strength of the wafer is then decreased. In addition, it has adverse effects on electric characteristics. Therefore, the processing-strained layer should be completely removed. For removing such a processing-strained layer, an etching process is carried out. There are two types of etching: dip-etching and single wafer etching.

Among the etching processes, the single wafer etching has been regarded as the most suitable etching process, which enables the control of the texture-size and surface roughness of a large-sized wafer. The single wafer etching is a process comprising dropping an etching solution onto the front surface of a flattened single wafer and horizontally rotating (spinning) the wafer to spread out the dripped etching solution over the front surface of the wafer. The etching solution supplied on the wafer is spread out over the surface of the wafer from a supplied point by centrifugal force caused by horizontally spinning the wafer, and finally reaches the edge of the wafer, so that the edge of the wafer as well as the front surface thereof can be also etched at the same time. Furthermore, most of the etching solution supplied is blown off from the edge thereof by centrifugal force and then collected into a cup or the like arranged on an etching device.

For example, as a process for manufacturing a semiconductor wafer that can effectively remove a processing-strained layer caused by mechanical grinding and retain the flatness of the wafer, there is disclosed one including the following steps; slicing a silicon single crystal ingot; chamfering the end face of the sliced wafer; flattening at least the front surface thereof obtained by slicing the semiconductor ingot by means of surface grinding or lapping; spin-etching the flattened front surface of the wafer; and polishing the etched front surface of the wafer into a mirror surface (e.g., see Patent Document 1).

Patent Document 1

Japanese Unexamined Patent Application Publication No. 11-135464 (claim 1, FIG. 1)

DISCLOSURE OF THE INVENTION

Problem to be Solved by the Invention

However, in the single wafer etching shown in the Patent Document 1, the etching solution is quantitatively dripped through a single supply nozzle, so that etching amount may vary. As a result, the front and back surfaces of a silicon wafer, subjected to the etching process, have deficiencies that the flatness of the wafer cannot be maintained after the flattening process including lapping and grinding. In addition, the desired surface roughness of the wafer cannot be obtained. Therefore, for improving the flatness and surface roughness thereof, a large amount of grinding margin is required in the mirror polishing process, so that the subsequent steps in mirror polishing will bear a heavy burden.

Accordingly, the object of the present invention is to provide a method for etching a single wafer, which can effectively attain high flatness and improve the productivity thereof.

Means for Solving Problem

As shown in FIG. 1, the invention of claim 1 is an improvement of a method for etching a single wafer, wherein a single thin disk-like silicon wafer 11 sliced from a silicon single crystal ingot is spun to etch a front surface of the wafer 11 with etching solutions 21, 22 supplied thereto.

The characteristic feature thereof lies in that a plurality of etching solution supply nozzles 31, 32 are disposed above and opposite to the front surface of the wafer 11 at different portions in the radial direction of the wafer, respectively and one or more conditions selected from the group consisting of temperatures, kinds, and supply flow rates of etching solutions 21, 22 from the plurality of supply nozzles 31, 32 are then changed.

In the single wafer etching apparatus as described in claim 1, plural etching solution supply nozzles 31, 32 are disposed above and opposite to the front surface of the wafer 11 at different portions in the radial direction of the wafer, respectively. From these etching solution supply nozzles 31, 32, optimum etching solutions 21, 22, where the temperature, kind, and supply flow rate are adjusted depending on the surface shape of the wafer 11, are supplied to the respective portions described above. Therefore, the degree of freedom to control the distribution of etching amount on the surface of the wafer 11 in the wafer surface can be increased and the wafer 11 can be thus effectively provided with high flatness.

The invention of claim 2 is related to the invention of claim 1, as further shown in FIG. 1, wherein the plurality of etching solution supply nozzles 31, 32 include a first supply nozzle 31 that supplies a first etching solution 21 to the center of the front surface of the wafer 11 and a second supply nozzle 32 that supplies a second etching solution 22 to the periphery of the front surface of the wafer 11, wherein the temperature of the first etching solution 21 supplied from the first supply nozzle 31 to the center of the front surface of the wafer 11 is higher than the temperature of the second etching solution 22 supplied from the second supply nozzle 32 to the periphery of the front surface of the wafer 11.

In the method for etching a single wafer as described in claim 2, the temperature of the first etching solution supplied on the center of the front surface of the wafer is higher than the temperature of the second etching solution supplied to the periphery of the front surface of the wafer, so that the rate of etching the wafer with the first etching solution can be higher than the rate of etching the wafer with the second solution. Typically, in the method for etching a single wafer, due to both the generation of heat by reaction and the transfer of a liquid in the peripheral direction of the wafer by centrifugal force, excessive etching may tend to occur in the periphery. However, in the method for etching a single wafer of the present invention, the temperature of the first etching solution 21 supplied from the first supply nozzle 31 to the center of the front surface of the wafer 11 is higher than the temperature of the second etching solution 22 supplied from the second supply nozzle 32 to the periphery of the front surface of the wafer 11, so that the periphery of the wafer 11 can be prevented from excessive etching. Therefore, the wafer 11 can be effectively provided with high flatness.

The invention of claim 3 is related to the invention of claim 1, as shown in FIG. 1, wherein the plurality of etching solution supply nozzles 31, 32 include a first supply nozzle 31 that supplies a first etching solution 21 to the center of the front surface of the wafer 11 and a second supply nozzle 32 that supplies a second etching solution 22 to the periphery of the front surface of the wafer 11, where the first etching solution 21 supplied from the first supply nozzle 31 to the center of the front surface of the wafer 11 is an etching solution having a higher etching rate than that of the second etching solution 22 supplied from the second supply nozzle 32 to the periphery of the front surface of the wafer 11.

In the method for etching a single wafer as described in claim 3, the first etching solution 21 supplied from the first supply nozzle 31 to the center of the front surface of the wafer 11 is an etching solution having a higher etching rate than that of the second etching solution 22 supplied from the second supply nozzle 32 to the periphery of the front surface of the wafer 11, so that the etching rate of the wafer with the first etching solution can be higher than the etching rate of the wafer with second etching solution. Typically, in the method for etching a single wafer, due to both the generation of heat by reaction and the transfer of a liquid in the peripheral direction of the wafer by centrifugal force, excessive etching may tend to occur in the periphery. However, in the method for etching a single wafer of the present invention, the first etching solution 21 supplied from the first supply nozzle 31 to the center of the front surface of the wafer 11 uses the kind of an etching solution having an etching rate higher than that of the second etching solution 22 supplied from the second supply nozzle 32 to the periphery of the front surface of the wafer 11, so that the periphery of the wafer 11 can be prevented from excessive etching. Therefore, the wafer 11 can be effectively provided with high flatness.

The invention of claim 4 is related to the invention of claim 1, as further shown in FIG. 1, wherein the plurality of etching solution supply nozzles 31, 32 include a first supply nozzle 31 that supplies a first etching solution 21 to the center of the front surface of the wafer 11 and a second supply nozzle 32 that supplies a second etching solution 22 to the periphery of the front surface of the wafer 11, where the supply flow rate of the first etching solution 21 supplied from the first supply nozzle 31 to the center of the front surface of the wafer 11 is higher than the supply flow rate of the second etching solution 22 supplied from the second supply nozzle 32 to the periphery of the front surface of the wafer 11.

In the method for etching a single wafer as described in claim 4, the supply flow rate of the first etching solution 21 supplied from the first supply nozzle 31 to the center of the front surface of the wafer 11 is higher than the supply flow rate of the second etching solution 22 supplied from the second supply nozzle 32 to the periphery of the front surface of the wafer 11, so that the etching rate of the wafer with the first etching solution can be higher than the etching rate of the wafer with the second etching solution. Typically, in the method for etching a single wafer, due to both the generation of heat by reaction and the transfer of a liquid in the peripheral direction of the wafer by centrifugal force, excessive etching may tend to occur in the periphery. However, in the method for etching a single wafer of the present invention, the supply flow rate of the first etching solution 21 supplied from the first supply nozzle 31 to the center of the front surface of the wafer 11 is higher than the supply flow rate of the second etching solution 22 supplied from the second supply nozzle 32 to the periphery of the front surface of the wafer 11, so that the periphery of the wafer 11 can be prevented from excessive etching. Therefore, the wafer 11 can be effectively provided with high flatness.

Effect of the Invention

As described above, according to the present invention, a plurality of etching solution supply nozzles are disposed above and opposite to the front surface of the wafer at different portions in the radial direction of the wafer, respectively and one or more conditions selected from the group consisting of temperatures, kinds, and supply flow rates of etching solutions from the plurality of etching solution supply nozzles are then changed. Therefore, an optimum etching solution, where the temperature, kind, or supply flow rate thereof are adjusted, is supplied to each part of the wafer from the plurality of etching solution supply nozzles. As a result, the degree of freedom to control the distribution of etching amount on the surface of the wafer can be increased and the wafer can be effectively provided with high flatness, thereby allowing the wafer to be easily subjected to the subsequent step of grinding.

In addition, the temperature of the first etching solution supplied from the first supply nozzle to the center of the front surface of the wafer is higher than the temperature of the second etching solution supplied from the second supply nozzle to the periphery of the front surface of the wafer, so that the etching rate of the wafer with the first etching solution can be higher than the etching rate of the wafer with the second etching solution. As a result, the excessive etching of the periphery of the wafer can be repaired, thereby efficiently providing the wafer with high flatness.

In addition, an etching solution used as the first etching solution supplied from the first supply nozzle to the center of the front surface of the wafer has a higher etching rate than that of the second etching solution supplied from the second supply nozzle to the periphery of the front surface of the wafer, so that the etching rate of the wafer with the first etching solution can be higher than the etching rate of the wafer with the second etching solution. As a result, the excessive etching of the periphery of the wafer can be repaired, thereby efficiently providing the wafer with high flatness.

Furthermore, the supply flow rate of the first etching solution supplied from the first supply nozzle to the center of the front surface of the wafer is higher than that of the second etching solution supplied from the second supply nozzle to the periphery of the front surface of the wafer, so that the etching rate of the wafer with the first etching solution can be higher than the etching rate of the wafer with the second etching solution. As a result, the excessive etching of the periphery of the wafer can be repaired, thereby efficiently providing the wafer with high flatness.

BEST MODE(S) FOR CARRYING OUT THE INVENTION

Hereinafter, preferred embodiments for carrying out the present invention will be described in more details with reference to the attached drawings.

Figure 1:
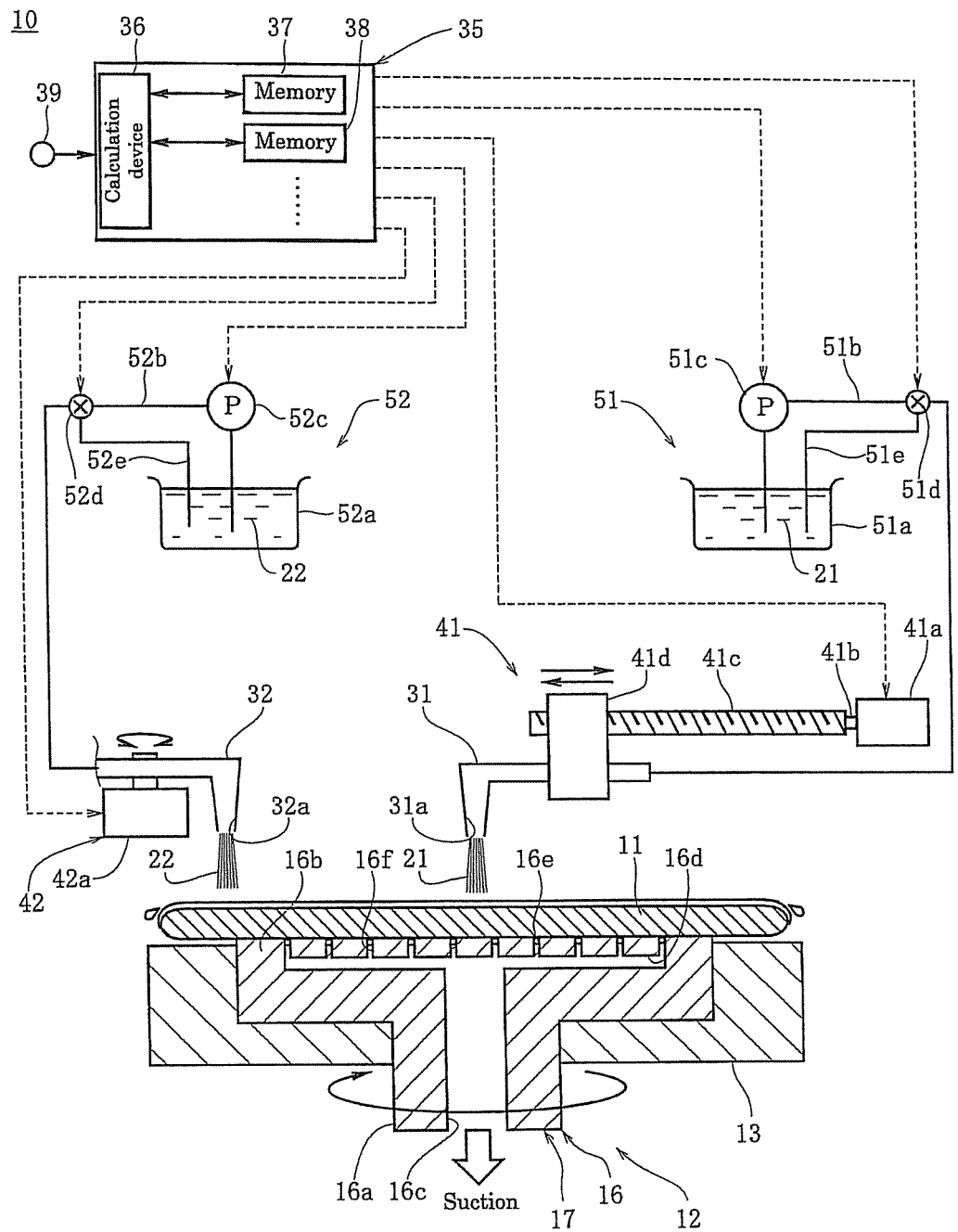
FIG. 1 is a vertical cross-sectional view of the substantial part of a method for etching a single wafer according to an embodiment of the present invention.

As shown in FIG. 1, a silicon single wafer etching apparatus 10 comprises a wafer chuck 12 housed in a chamber, on which a thin disk-like silicon wafer 11 is mounted and retained horizontally. The wafer chuck 12 comprises a disk-like base member 13 having a diameter larger than that of the wafer 11 and a holding axis 16 in which an axial part 16*a* is inserted through a through hole 13*a* formed in the center of the base member 13 and extended in the vertical direction. The holding axis 16 comprises the axial part 16*a*; a wafer-receiving part 16*b* having a large diameter, which is integrally formed with the axial part 16*a* and arranged on the front surface of the axial part 16*a*; a through hole 16*c*, which is formed in the center of the holding axis 16 and extends from the bottom face to the top of the holding axis 16 in the vertical direction; a plurality of communicating holes 16*d* each having an end communicating with the upper end of the through hole 16*c* and an opposite closed end, where the communicating holes 16*d* radiate outward around the through hole 16*c* in the radial direction of the wafer-receiving part 16*b*; a plurality of ring grooves 16*e* concentrically formed in the front surface of the wafer-receiving part 16*b*; and a plurality of small pores 16*f* allowing the communicating holes 16*d* and the ring grooves 16*e* to communicate with each other. A vacuum pump (not shown) is connected and communicated with the bottom end of the through hole 16*c*. The front surface of the wafer-receiving part 16*b* is configured to mount the wafer 11 concentrically with the wafer-receiving part 16*b*. Then, when the vacuum pump is driven to make the inner pressure of the through hole 16*c* negative, the negative pressure in the through hole 16*c* allows the rear surface of the wafer 11 to be adsorbed onto the wafer-receiving part 16*b* to retain the wafer 11 horizontally. In addition, the silicon single wafer etching apparatus 10 comprises a spinning device 17 for spinning the wafer 11 around the vertical axis thereof in a horizontal plane. The spinning device 17 comprises the holding axis 16, a driving motor (not shown) for rotating the holding axis 16. It is configured that the driving motor rotates the holding axis 16 to allow the wafer 11 retained on the holding axis 16 to be spun with the holding axis 16. Alternatively, it may be configured that when the driving motor rotates the holding axis, the wafer is spun with the holding axis while the base member is being fixed without spinning.

Figure 2:
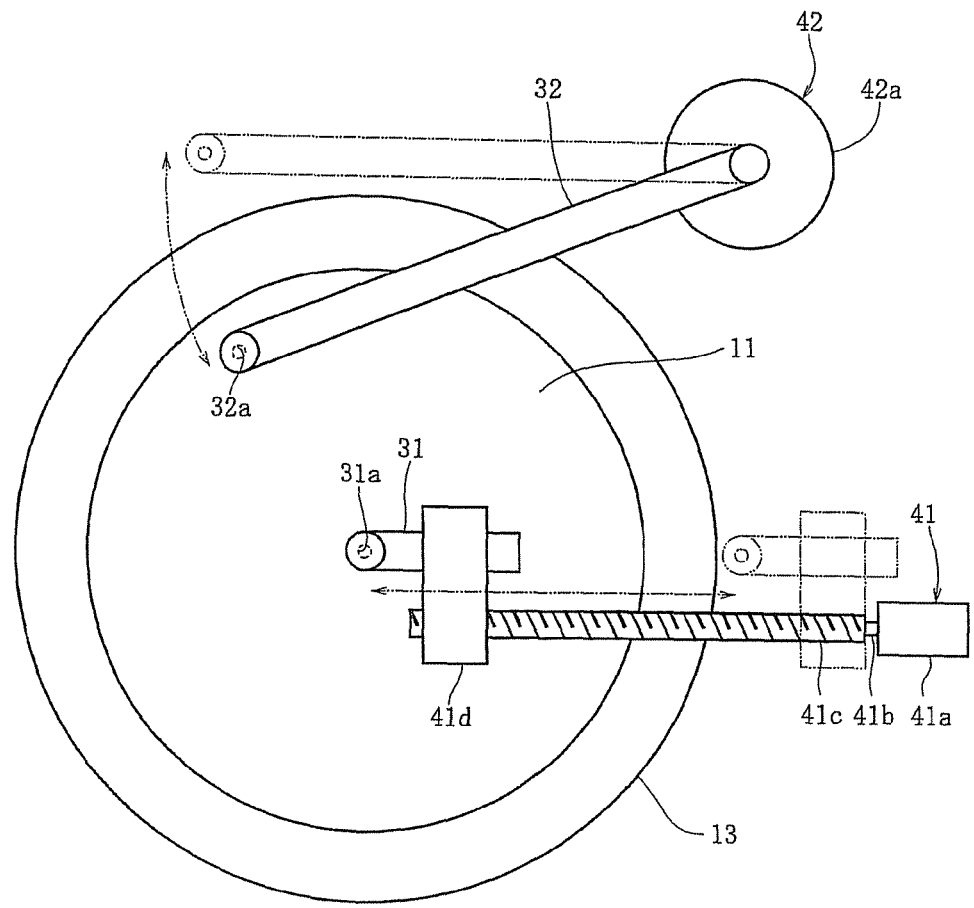
FIG. 2 is a plane view showing the relationship between first and second supply nozzles and the wafer.
Figure 3:
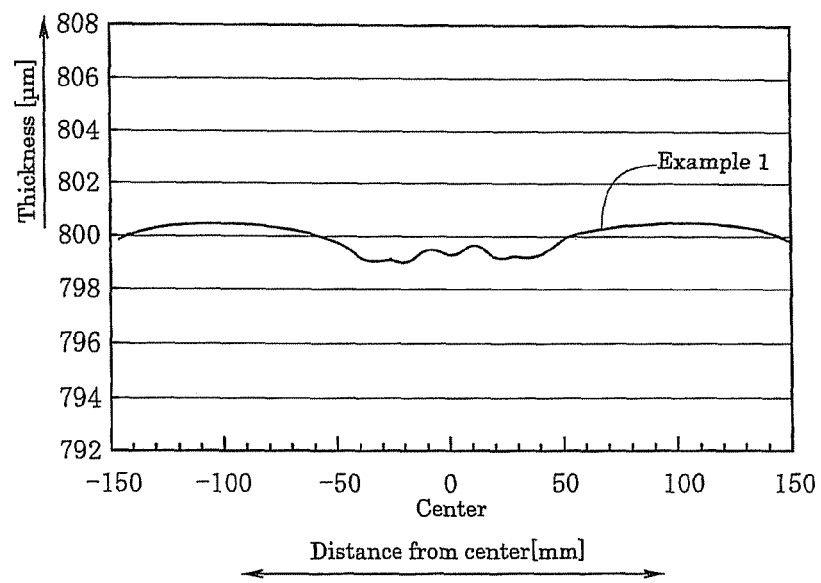
FIG. 3 is a graph showing variation in the wafer thickness in Example 1.
Figure 4:
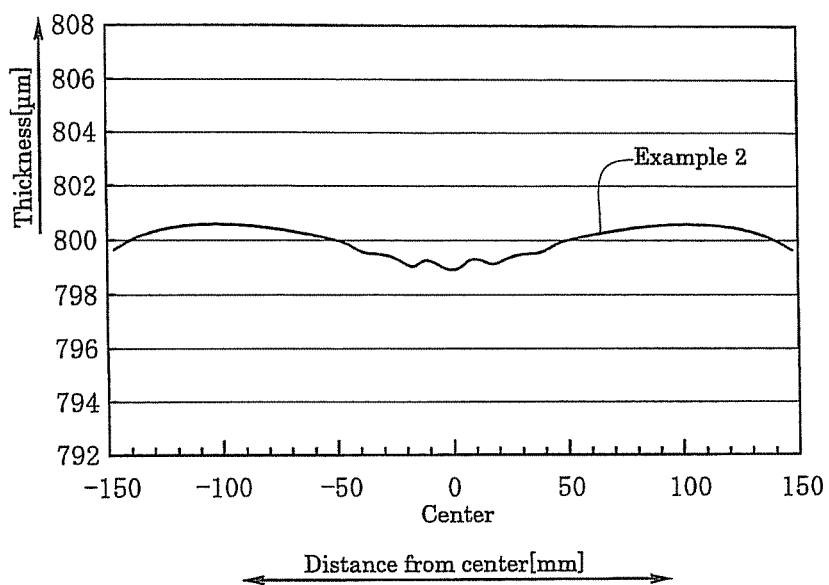
FIG. 4 is a graph showing variation in the wafer thickness in Example 2.
Figure 5:
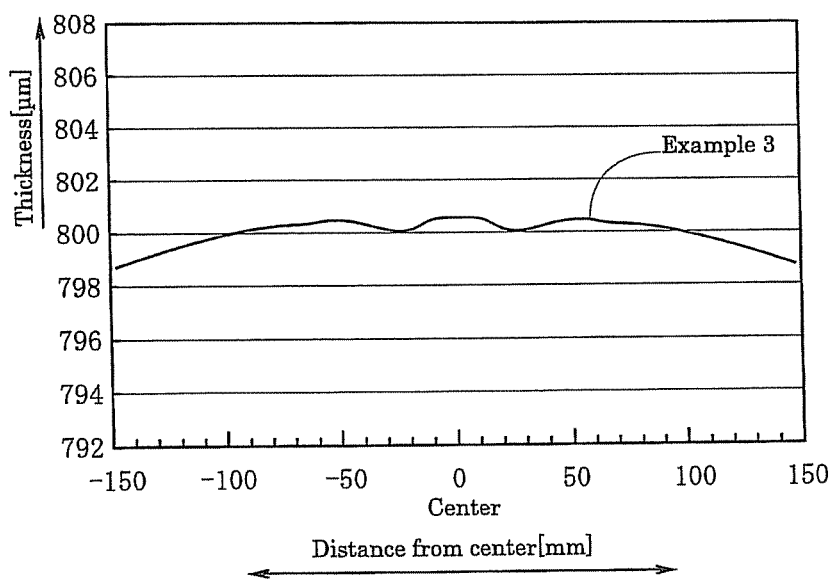
FIG. 5 is a graph showing variation in the wafer thickness in Example 3.
Figure 6:
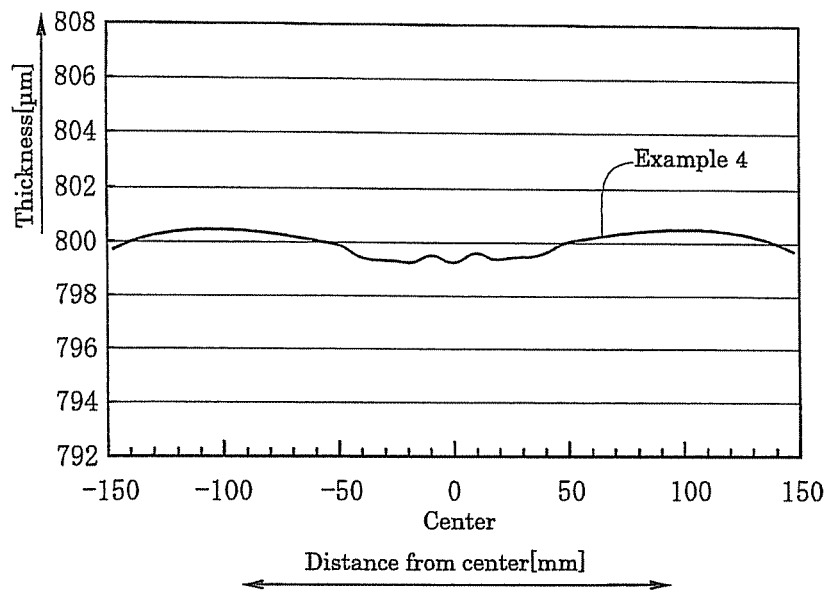
FIG. 6 is a graph showing variation in the wafer thickness in Example 4.
Figure 7:
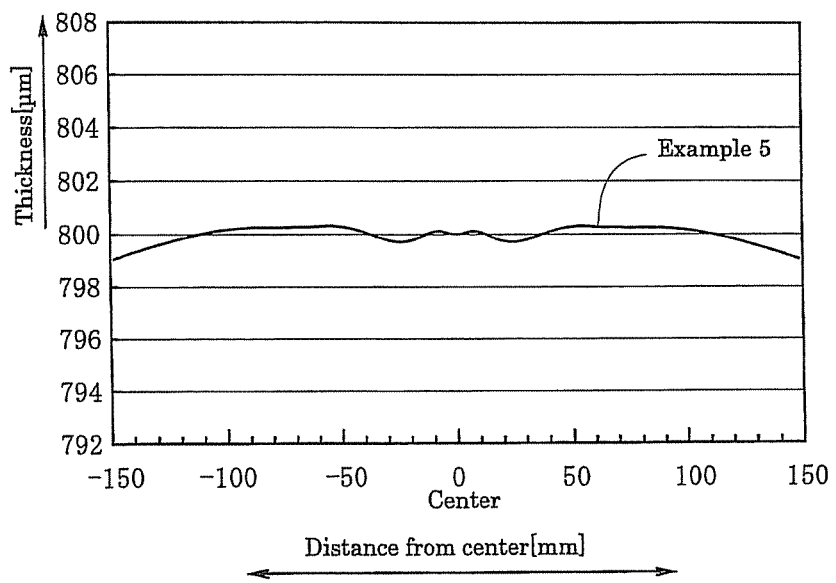
FIG. 7 is a graph showing variation in the wafer thickness in Example 5.
Figure 8:
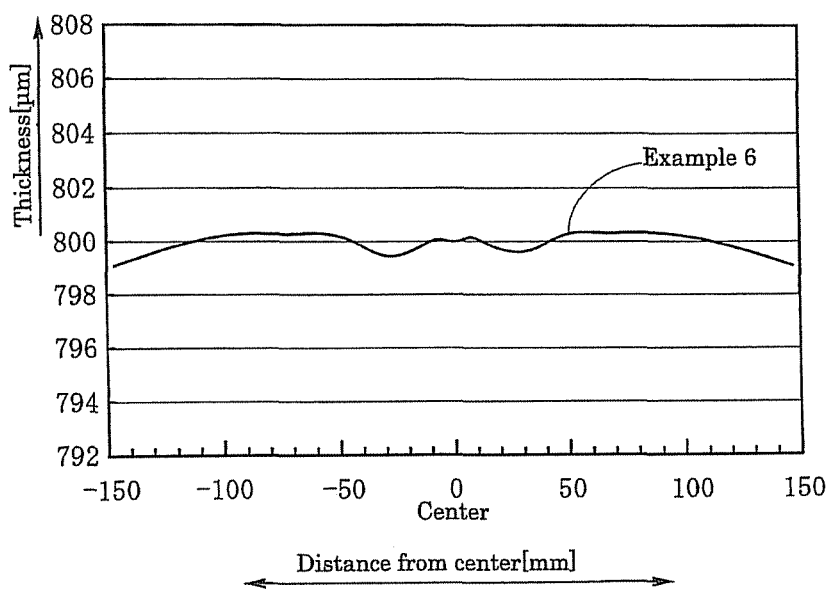
FIG. 8 is a graph showing variation in the wafer thickness in Example 6.
Figure 9:
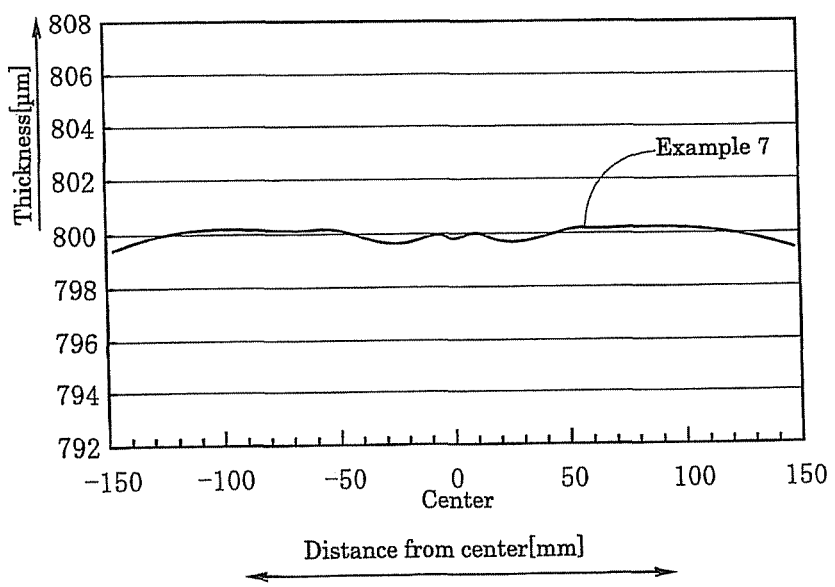
FIG. 9 is a graph showing variation in the wafer thickness in Example 7.

In addition, as shown in FIG. 1 and FIG. 2, a plurality of supply nozzles 31, 32 are disposed above and opposite to the front surface of the wafer 11 at different positions in the radial direction of the wafer 11, respectively. In this embodiment, the plurality of the supply nozzles 31, 32 include a first supply nozzle 31 that supplies a first etching solution 21 to the center of the front surface of the wafer 11 and a second supply nozzle 32 that supplies a second etching solution 22 to the periphery of the front surface of the wafer 11. These supply nozzles 31, 32 can be independently moved, respectively by nozzle-moving devices 41, 42 disposed separately. The first nozzle-moving device 41 for moving the first supply nozzle 31 comprises: a rotary motor 41*a* that directly moves the first supply nozzle 31 in the axial direction; a ball screw 41*c* coaxially connected to a rotary axis 41*b* of the rotary motor 41*a*; and a female screw member 41*d* for holding the first supply nozzle 31 in which a female screw that can be screwed by the ball screw 41*c* is formed. By allowing the ball screw 41*c* to rotate by rotating the rotational axis 41*b* of the rotary motor 41*a*, the first supply nozzle 31 can be directly moved in the axial direction thereof together with the female screw member 41*d*. In addition, as illustrated in FIG. 2 in detail, the first supply nozzle is configured that it can oscillate between a first evacuation position (i.e., a position represented by a two-dot chain line in FIG. 2) where a first discharge opening 31*a* does not face to the front surface of the wafer 11 and a first liquid supplying position (i.e., a position represented by a solid line) where the first discharge opening 31*a* faces to the center of the front surface of the wafer 11, due to the first nozzle-moving device 41. On the other hand, the second nozzle-moving device 42 that moves the second supply nozzle 32 is mounted on the base end of the second supply nozzle 32 and is provided with a stepping motor 42*a* that allows the tip of the second supply nozzle 32 to oscillate around the base end. Furthermore, the second supply nozzle 32 is configured that it can oscillate between a second evacuation position (i.e., a position represented by a two-dot chain line in FIG. 2) where the second discharge opening 32*a* does not face to the front surface of the wafer 11 and a second liquid supplying position (i.e., a position represented by a solid line) where the second discharge opening 32*a* faces to the periphery of the front surface of the wafer 11, due to the second nozzle-moving device 42. Here, the periphery of the front surface of the wafer 11, where the second discharge opening 32*a* is positioned on the second liquid supplying position, is a given distance within the range of (0.8 to 1.0)D/2 from the center of the wafer 11 to the edge thereof, when the outer diameter of the wafer 11 is D.

Referring again to FIG. 1, the first supply nozzle 31 is connected to an etching solution supplying device 51 that discharges the first etching solution 21 from the first discharge opening 31*a* to the center of the front surface of the wafer 11. In contrast, the second supply nozzle 32 is connected to a second etching solution supplying device 52 that discharges the second etching solution 22 from the second discharge opening 32*a* to the center of the front surface of the wafer 11. The first etching solution supplying device 51 comprises a first tank 51*a* for reserving the first etching solution 21, a first conduit line 51*b* that allows the first tank 51*a* to connect to and communicate with the base end of the first supply nozzle 31, a first pump 51*c* for supplying the first etching solution 21 from the first tank 51*a* mounted on the first conduit line 51*b* to the first supply nozzle 31, and a first flow control valve 51*d* for adjusting the supply flow rate of the first etching solution 21 to the first supply nozzle 31 mounted on the first conduit line 51*b*. The first tank 51*a* is provided with a first temperature controller (not shown) that is capable of controlling the temperature of the first etching solution 21 in the tank 51*a*. Here, the reference numeral 51*e* in FIG. 1 is a first return tube for returning a surplus amount of the first etching solution 21 supplied by the first pump 51*a* to the first tank 51*a*. In contrast, the second etching solution supplying device 52 comprises a second tank 52*a* for reserving the second etching solution 22, a second conduit line 52b for allowing the second tank 52a to connect to and communicate with the base end of the second supply nozzle 32, a second pump 52c for supplying the second etching solution 22 from the second tank 52a mounted on the second conduit line 52b to the second supply nozzle, and a second flow control valve 52d for adjusting the supply flow rate of the second etching solution 22 to the second supply nozzle 32 mounted on the second conduit line 52b. Here, the reference numeral 52e in FIG. 1 is a second return tube for returning a surplus amount of the second etching solution 22 supplied by the second pump 52a to the first tank 51a.

One or more selected from the groups consisting of temperature, kind, and supply flow rate of each of the first and second etching solutions 21, 22 can be changed. When the temperatures of the first and second etching solution 21, 22 are changed, the first etching solution 21 is adjusted to a predetermined temperature of preferably in the range of 15 to 40° C., more preferably in the range of 15 to 30° C. by the first temperature controller and the second etching solution 22 is adjusted to a predetermined temperature lower than that of the first etching solution 21, preferably in the range of 0 to 30° C., more preferably in the range of 5 to 20° C. Here, the reason of why the temperature of the first etching solution 21 is limited in the range of 15 to 40° C. is that less than 15° C. leads to a decrease in productivity as the etching rate of a main part of the wafer surface lowers and more than 40° C. leads to difficulty in maintenance of the degree of wafer flatness as the viscosity of the etching solution decreases. The reason of why the temperature of the etching solution 22 is limited in the range of 0 to 30° C. is that less than 0° C. leads to coagulation of the etching solution and more than 30° C. leads to insufficient effects because of a decrease in difference of the etching rates with the first etching solution.

Furthermore, when each of the kinds of the first and second etching solution 21, 22 is changed, the first etching solution 21 used is one preferably having an etching rate of 0.2 to 3 μm/sec, more preferably 0.3 to 1 μm/sec at 30° C. and the second etching solution 22 used is one having an etching rate smaller than the first etching solution, preferably 0.01 to 1 μm/sec, more preferably 0.01 to 0.3 μm/sec. Here, the reason of why the etching rate of the first etching solution 21 is limited in the range of 0.2 to 3 μm/sec is that less than 0.2 μm/sec leads to a reduction in productivity and more than 3 μm leads to a difficulty in control of the shape of wafer because of being obstructive to the progress of etching as a matter of practice. The reason of why the etching rate of the second etching solution 22 is limited in the range of 0.01 to 1 μm/sec is that less than 0.01 μm/sec leads to being virtually incapable of processing etching and controlling wafer forming and more than 1 μm/sec leads to insufficient effects because of a decrease in difference of the etching rates with the first etching solution. The above first etching solution 21 may be one having a weight ratio (% by weight) of fluorinated acid (HF):nitric acid ($HNO_3$):phosphate ($H_3PO_4$):water ($H_2O$)=(5 to 20):(5 to 40):(30 to 40):remainder (rest) after mixing with an aqueous acid solution. The second etching solution 22 may be one having a weight ratio (% by weight) of fluorinated acid (HF):nitric acid ($HNO_3$):phosphate ($H_3PO_4$):water ($H_2O$)=(0.5 to 10):(20 to 50):(30 to 40) remainder (rest).

Furthermore, when the supply flow rate of each of the first and second etching solutions 21, 22 is changed, the supply flow rate of the first etching solution 21 is adjusted to preferably 1 to 10 l/min, more preferably 2 to 5 l/min. The supply flow rate of the second etching solution 22 is adjusted to one smaller than the supply flow rate, and preferably 0.1 to 5 l/min, more preferably 0.5 to 3 l/min. Here, the reason of why the supply flow rate of the first etching solution 21 is limited within the range of 1 to 10 l/min is that less than 1 l/min leads to being obstructive to the progress of etching and more than 10 l/min leads to a decrease in effect to plant costs because of enlargement of facilities. The reason of why the supply flow rate of the second etching solution 22 is limited within the range of 0.1 to 5 l/min is that less than 0.1 l/min leads to offset of the effects of the second etching solution 22 and more than 5 l/m leads to unstable liquid conditions because of an increase in liquid interference.

Further, the single wafer etching apparatus 10 has a detecting device 39 for detecting irregularities of the surface of the wafer 11, by a laser reflection scheme utilizing laser reflection at the surface of the wafer 11. The detecting device 39 has a detection output connected to a control input of the control device 35, and the control device 35 has a control output connected to the driving motor (not shown) of the spinning device 17, to the first pump 51c and first flow control valve 51d of the etching solution supplying device 51, to the second pump 52c and second flow control valve 52d of the second etching solution supplying device 52, to the rotary motor 41a of the first nozzle-moving device 41, and to the stepping motor 42a of the second nozzle-moving device 42. The control device 35 is configured, based on the detection output of the detecting device 39, to control the rotational speed of the driving motor of the spinning device 17, thereby setting the rotational speed of the wafer 11; to control the first pump 51c and first flow control valve 51d of the etching solution supplying device 51 and the second pump 52c and second flow control valve 52d of the second etching solution supplying device 52, thereby determining supplying states of etching solutions from the first and second supply nozzles 31, 32; and to control the rotary motor 41a of the first nozzle-moving device 41 and the stepping motor 42a of the second nozzle-moving device 42, thereby setting the states and positions of the first and second supply nozzles 31, 32, respectively. Concretely, the control device 35 has a calculation device 36 such as a CPU, and a plurality of memories 37, 38, . . . . The plurality of memories 37, 38, . . . store therein, at least, the surface shape of the wafer 11 before processing, the positions of the first and second supply nozzles 31, 32, the amounts of the etching solutions discharged from the first and second supply nozzles 31, 32, the etched state of the surface of the wafer 11 during the processing, a reference shape of the wafer 11 after the processing, respectively. The calculation device 36 is configured to conduct calculations based on the wafer surface shape, nozzle positions, and the like stored in the memories 37, 38, . . . , thereby obtaining movements of the nozzles 31, 32 and the discharging states of the etching solutions. Further, the memories 37, 38, . . . store therein data of the surface shape of the wafer 11 before processing detected by the detecting device 39. Note that it is possible for the memories 37, 38, . . . : to store data of a surface shape of each wafer 11 to be processed, which data is detected by the detecting device 39; to store data of a surface shape of one wafer 11 every predetermined number of wafers 11, which data is representatively detected by the detecting device 39; or to store data of a surface shape of a predetermined wafer 11 every ingot, which data is representatively detected by the detecting device 39; or, it is possible to use a predetermined data for each type of wafer 11. Moreover, the detecting device 39 may be configured as an independent device for measuring a surface shape of a wafer, without placing the detecting device in the single wafer etching apparatus 10.

The method for etching the wafer 11 using the single wafer etching apparatus 10 as constructed above will be described.

At first, in the state that the wafer 11 is mounted on the chuck 12, a vacuum pump, which is connected to and communicated with the bottom end of the through hole 16c of a holding assembly 16, is actuated to make the pressures of the through hole 16c, communicating hole 16d, small hole 16f, and ring groove 16e negative, and the negative pressures then keep the wafer 11 in a horizontal position. In this state, the driving motor of the spinning device is actuated to allow the wafer 11 to spin in horizontal plane together with the holding assembly 16 and the base member 13. Alternatively, only the holding axis 21 may spin, while the base member 19 is not allowed to spin and fixed. Subsequently, the rotary motor 41a of the first nozzle-moving device 41 and the stepping motor 42a of the second nozzle-moving device 42 are respectively driven so as to move the first supply nozzle 31 to a position that allows the discharge opening 31a to face to the center of the front surface of the wafer and so as to turn the second supply nozzle 32 to a position that allows the discharge opening 32a to face to the periphery of the front surface of the wafer, and then the first and second pumps 51c, 52c are driven and the first and second flow control valves 51d, 52d are opened so as to supply the first and second etching solutions 21, 22 from the first and second discharge openings 31a, 32a of the first and second supply nozzles 31, 32 to the center of the front surface and the periphery of the front surface of the wafer 11, respectively. The first etching solution 21 supplied on the center of the front surface of the wafer 11 gradually moves toward the edge portion of the wafer 11 from the periphery of the front surface of the wafer 11 while etching a processing-strained layer on the front surface of the wafer. The centrifugal force with the spinning movement of the wafer 11 makes most of the first and second etching solutions 21, 22 on the wafer 11 into droplets and scatters these droplets outside of the wafer 11, followed by discharging them outside of the chamber.

Here, when the first etching solution supplied from the first supply nozzle to the center of the front surface of the wafer is set to a temperature higher than the temperature of the second etching solution supplied from the second supply nozzle to the periphery of the front surface of the wafer, the etching rate of the wafer with the first etching solution increases higher than the etching rate of the second etching solution. As a result, the excessive etching of the periphery of the wafer 11 can be compensated and the wafer 11 can be effectively provided with high flatness. In addition, when the first etching solution supplied from the first supply nozzle to the center of the front surface of the wafer is an etching solution having a higher etching rate than that of the second etching solution supplied from the second supply nozzle to the periphery of the front surface of the wafer, the etching rate of the wafer with the first etching solution is higher than the etching rate of the wafer with the second etching solution. As a result, the excessive etching of the periphery of the wafer 11 can be compensated and the wafer can be effectively provided with high flatness. Furthermore, when the supply flow rate of the first etching solution supplied from the first supply nozzle to the center of the front surface of the wafer is higher than the supply flow rate of the second etching solution supplied from the second supply nozzle to the periphery of the front surface of the wafer, the etching rate of the wafer with the first etching solution increases higher than the etching rate of the wafer with the second etching solution. As a result, the excessive etching of the periphery of the wafer 11 is compensated and the wafer can be effectively provided with high flatness.

Note that although the embodiment has been explained for a situation for repairing an excessive etching of a periphery of a wafer 11 which becomes problematic upon etching by a single supply nozzle, the present invention is not limited thereto. Since a surface shape of a wafer after slicing or of a wafer subjected to a mechanical flattening process including lapping after slicing, is not uniform in a radial direction of the wafer and has a thickness variation, undulations, and the like caused thereon, it is enough to conduct etching so as to repair them. Namely, it is possible to effectively attain high flatness of a wafer 11, by previously measuring a surface shape of the wafer 11 before etching, and by adjusting one or more conditions selected from the group consisting of temperatures, kinds, and supply flow rates of etching solutions to be supplied from the etching solution supply nozzles, depending on the surface shape of the wafer, so as to compensate for a difference between the measured surface shape and an intended surface shape of the wafer 11 after etching. Furthermore, although the above embodiment has been described for a situation where the number of supply nozzles is two, the supply nozzles may be three, four, or more, in number.

EXAMPLES

Next, Examples of the present invention will be described in more detail with reference to Comparative Example.

Example 1

As shown in FIGS. 1 and 2, a wafer obtained by slicing a silicon single crystal ingot was subjected to chamfering and mechanical grinding (lapping), so that there was also prepared a silicon wafer 11 of 300 mm in diameter of which front and back surfaces were flattened. In addition, a first etching solution 21 was prepared by mixing an aqueous hydrofluoric acid solution at a weight concentration of 50%, an aqueous nitric acid solution at a weight concentration of 70%, and an aqueous phosphoric acid solution at a weight concentration of 85% in a volume ratio of 4:7.4:6 and then reserved in a first tank 51a heated at 30° C. On the other hand, a second etching solution 22 was prepared by mixing 50% by weight concentration of an aqueous fluorine acid solution, 70% by weight concentration of an aqueous nitric acid solution, and 80% by weight concentration of an aqueous phosphoric acid solution in a volume ratio of 4:7.4:6 and then reserved in a second tank 52a heated at 20° C. Under such conditions, a wafer 11 was mounted on a chuck 12 such that the front surface of the wafer 11 was faced upwardly. Subsequently, the wafer 11 was horizontally rotated. After that, the first discharge opening 31a of a first supply nozzle 31 was then reciprocated between −50 mm to +50 mm from a basic point (0 mm), which was the center of the front surface of the wafer 11, or the center of the wafer 11, at a velocity of 40 mm/sec, while the second discharge opening 32a of a second supply nozzle 32 was then reciprocated between 30 mm to 0 mm from a basic point (0 mm), which was the periphery of the front surface of the wafer 11, or the periphery of the wafer 11, at a velocity of 40 mm/sec. Under such conditions, the first etching solution 21 was supplied from the first supply nozzle 31 onto the center of the front surface of the wafer 11 at a flow rate of 4 l/min, while the second etching solution 22 was supplied from the second supply nozzle 32 onto the periphery of the front surface of the wafer 11. By centrifugal force generated by the horizontal spinning of the wafer 11, the first etching solution 21 was spread out from the center of the front surface of the wafer 11 to the edge thereof, while the second etching solution 22 was spread out from the periphery of the front surface of the wafer 11 to the side end thereof, thereby etching a processing-strained layer caused by the planarization processing of the wafer 11. Therefore, the etched wafer was provided for Example 1.

Example 2

Etching of wafer was carried out by the same way as that of Example 1, except that a second etching solution used was an etching solution prepared by mixing an aqueous hydrofluoric acid solution at a weight concentration of 50%, an aqueous nitric acid solution at a weight concentration of 70%, and an aqueous phosphoric acid solution at a weight concentration of 85% at a volume ratio of 3:8:6 and then kept at a temperature of 30° C. Therefore, the etched wafer was provided for Example 2.

Example 3

Etching of wafer was carried out by the same way as that of Example 1, except that the second etching solution was supplied from the second supply nozzle onto the periphery of the front surface of the wafer at a flow rate of 3 l/min. Therefore, the etched wafer was provided for Example 3.

Example 4

Etching of wafer was carried out by the same way as that of Example 1, except that a second etching solution used was an etching solution prepared by mixing an aqueous hydrofluoric acid solution at a weight concentration of 50%, an aqueous nitric acid solution at a weight concentration of 70%, and an aqueous phosphoric acid solution at a weight concentration of 85% at a volume ratio of 3:8:6. Therefore, the etched wafer was provided for Example 4.

Example 5

Etching of wafer was carried out by the same way as that of Example 1, except that a second etching solution used was an etching solution prepared by mixing an aqueous hydrofluoric acid solution at a weight concentration of 50%, an aqueous nitric acid solution at a weight concentration of 70%, and an aqueous phosphoric acid solution at a weight concentration of 85% at a volume ratio of 3:8:6 and then kept at a temperature of 30° C. Subsequently, the second etching solution was supplied from the second supply nozzle onto the periphery of the front surface of the wafer at a flow rate of 3 l/min. Therefore, the etched wafer was provided for Example 5.

Example 6

Etching of wafer was carried out by the same way as that of Example 1, except that the temperature of the second etching solution was kept at 30° C. and the second etching solution was supplied from the second supply nozzle to the periphery of the front surface of the wafer at a flow rate of 3 l/min. Therefore, the etched wafer was provided for Example 6.

Example 7

Etching of wafer was carried out by the same way as that of Example 1, except that a second etching solution used was an etching solution prepared by mixing an aqueous hydrofluoric acid solution at a weight concentration of 50%, an aqueous nitric acid solution at a weight concentration of 70%, and an aqueous phosphoric acid solution at a weight concentration of 85% at a volume ratio of 3:8:6. Subsequently, the second etching solution was supplied from the second supply nozzle onto the periphery of the front surface of the wafer at a flow rate of 3 l/min. Therefore, the resulting wafer was provided for Example 7.

Comparative Example 1

Etching of wafer was carried out by the same way as that of Example 1, except that the second etching solution was kept at a temperature of 30° C. The resulting wafer was provided for Comparative Example 1.

The temperatures (° C.) of the first and second solutions, kinds (the percentages of the aqueous fluorinated acid (HF) solution in the mixtures) (% by weight), and flow rates (l/m) of the first and second etching solutions of Examples 1 to 7 and Comparative Example 1 as described above are listed in Table 1 with the differences between the first and second etching solutions.

TABLE 1

| | 1st Etching Solution | | | 2nd Etching Solution | | | Differences |
|---|---|---|---|---|---|---|---|
| | Temp. (° C.) | HF conc. (wt %) | Supply flow rate (l/min) | Temp. (° C.) | HF conc. (wt %) | Supply flow rate (l/min) | between 1st and 2nd Etching solution |
| Example 1 | 30 | 9 | 4 | 20 | 9 | 4 | Temperatures |
| Example 2 | 30 | 9 | 4 | 30 | 7 | 4 | Concentrations |
| Example 3 | 30 | 9 | 4 | 30 | 9 | 3 | Flow rates |
| Example 4 | 30 | 9 | 4 | 20 | 7 | 4 | Temperatures, Concentrations |
| Example 5 | 30 | 9 | 4 | 30 | 7 | 3 | Concentrations, Flow rates |
| Example 6 | 30 | 9 | 4 | 20 | 9 | 3 | Temperatures, Flow rates |
| Example 7 | 30 | 9 | 4 | 20 | 7 | 3 | Temperatures, Concentrations, Flow rates |
| Comparative Example 1 | 30 | 9 | 4 | 30 | 9 | 4 | Nothing |

Comparative Test and Evaluation

Figure 10:
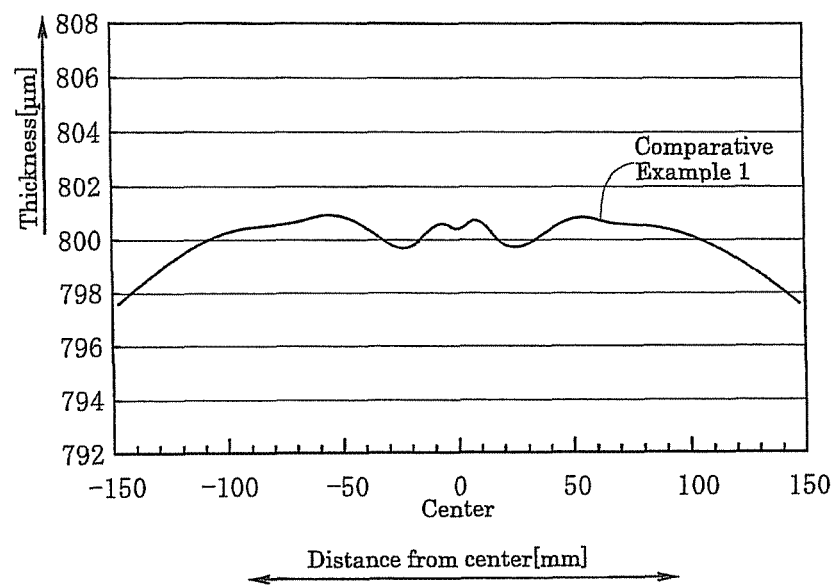
FIG. 10 is a graph showing variation in the wafer thickness in Comparative Example 1.

Thicknesses of the respective silicon wafers, on which the single wafer etching procedures were performed according to Examples 1 to 7 and Comparative Example 1, were measured using a flatness-measuring equipment (Wafercom, manufactured by Doi Precision Lapping Co., Ltd.), respectively. The measuring results in Example 1 to 7 are shown in FIGS. 3 to 9 and the measuring results in Comparative Example 1 are shown in FIG. 10. As is evident from FIGS. 3 to 10, Examples 1 to 7 (FIGS. 3 to 9), which represent the surfaces of the respective wafers 11 etched by supplying the first and second etching solutions from the respective first and second supply nozzles, were found to be flat, compared with Comparative Example 1 (FIG. 10) which represents the surface of the wafer etched by supplying the etching solution form the single supply nozzle.

INDUSTRIAL APPLICABILITY

Therefore, the present invention can be applied on a method for etching a single wafer such that the front surface of each of wafers is etched one by one while being horizontally retained and rotated.

The invention claimed is:

1. A method for etching a single wafer, wherein a single thin disk-like silicon wafer sliced from a silicon single crystal ingot is spun to etch a front surface of the wafer with etching solutions supplied thereto, comprising the steps of:

disposing a plurality of etching solution supply nozzles above and opposite to the front surface of the wafer at different portions in the radial direction of the wafer; and changing supply flow rates of etching solutions from the plurality of etching solution supply nozzles, wherein the plurality of etching solution supply nozzles includes a first supply nozzle that supplies a first etching solution to the center of the front surface of the wafer and a second supply nozzle that supplies a second etching solution to the periphery of the front surface of the wafer, wherein the supply flow rate of the first etching solution supplied from the first supply nozzle to the center of the front surface of the wafer is higher than the supply flow rate of the second etching solution supplied from the second supply nozzle to the periphery of the front surface of the wafer, wherein the first etching solution has a weight ratio (% by weight) of fluorinated acid (HF):nitric acid ($HNO_3$):phosphoric acid ($H_3PO_4$):water ($H_2O$)=(5 to 20):(5 to 40):(30 to 40):remainder after mixing with an aqueous acid solution, and the second etching solution has a weight ratio (% by weight) of fluorinated acid (HF):nitric acid ($HNO_3$):phosphoric acid ($H_3PO_4$):water ($H_2O$)=(0.5 to 10):(20 to 50):(30 to 40):remainder after mixing with an aqueous acid solution, and wherein the first etching solution has an etching rate of 0.2 to 3 μm/sec at 30° C., and the second etching solution has an etching rate smaller than the etching rate of the first etching solution, and is 0.01 to 1 μm /sec, at 30° C.

2. The method of claim 1, wherein the first etching solution has an etching rate of 0.3 to 1 μm /sec at 30° C. and the second etching solution has an etching rate smaller than the etching rate of the first etching solution, and is 0.01 to 0.3 μm /sec at 30° C.

* * * * *